United States Patent [19]

Sterling

[11] 4,341,588
[45] Jul. 27, 1982

[54] SEMICONDUCTOR PROCESSING

[75] Inventor: Henley F. Sterling, Great Dunmow, England

[73] Assignee: ITT Industries, Inc., New York, N.Y.

[21] Appl. No.: 209,234

[22] Filed: Nov. 21, 1980

Related U.S. Application Data

[63] Continuation of Ser. No. 66,961, Aug. 17, 1979, abandoned.

[30] Foreign Application Priority Data

Sep. 7, 1978 [GB] United Kingdom ............... 35942/78

[51] Int. Cl.³ .............................................. C30B 1/04
[52] U.S. Cl. ................................... 156/601; 156/603; 156/613; 156/DIG. 88; 148/175
[58] Field of Search ............... 156/610, 613, 614, 607, 156/DIG. 88, DIG. 84, 601; 29/576 S; 204/165, 168, 192 S, 192 N; 427/86; 148/175

[56] References Cited

U.S. PATENT DOCUMENTS

| | | | |
|---|---|---|---|
| 3,770,565 | 11/1973 | Schoolar et al. | 148/175 |
| 3,914,856 | 10/1975 | Fang | 148/174 |
| 3,993,533 | 11/1976 | Milnes et al. | 156/613 |
| 4,027,053 | 5/1977 | Lesk | 427/53.1 |
| 4,066,527 | 1/1978 | Takagi et al. | 156/610 |

FOREIGN PATENT DOCUMENTS

| | | |
|---|---|---|
| 2109 | 5/1979 | European Pat. Off. . |
| 953332 | 3/1964 | United Kingdom ............... 156/607 |

OTHER PUBLICATIONS

IBM Technical Disclosure Bulletin, vol. 19, No. 10, 3/77, 3955, 3956 (Gutfeld).
C&EN, Jan. 2, 1978, p. 8.

Primary Examiner—Hiram Bernstein
Attorney, Agent, or Firm—John T. O'Halloran; Peter R. Ruzek

[57] ABSTRACT

Crystalline semiconductor material is produced in strip or sheet form by a gas process. The corresponding amorphous semiconductor is vapour deposited on to a substrate material which is subsequently removed from the amorphous semiconductor. The semiconductor is then selectively heated to induce crystallization. Devices may be fabricated on the crystalline material in tandem with the deposition and crystallization processes.

16 Claims, 1 Drawing Figure

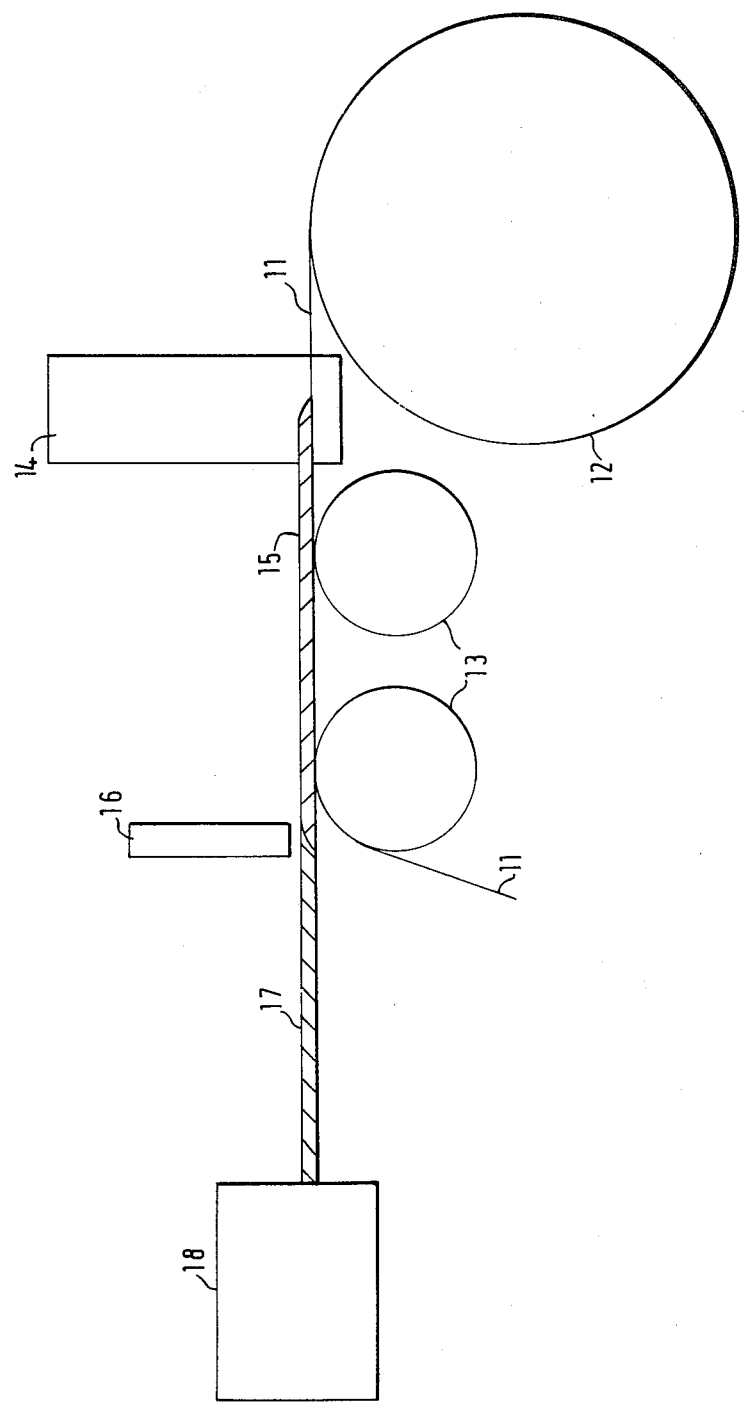

4,341,588

SEMICONDUCTOR PROCESSING

This is a continuation of application Ser. No. 66,961, filed Aug. 16, 1971, now abandoned.

BACKGROUND OF THE INVENTION

This invention relates to semiconductor material processing, and in particular to a method and arrangement for producing crystalline semiconductor materials in strip or sheet forms.

One of the major problems in the preparation of semiconductor devices is that the basic crystalline material is obtained by a batch process wherein individual single crystal rods are sliced into discs for subsequent processing. The present crystal pulling and slicing techniques are relatively time consuming. Hence, devices requiring a relatively large semiconductor user are prohibitively costly. Furthermore, present techniques are limited to the production of semiconductor discs about 10 cm in diameter thus limiting the size and/or the number of devices that can be formed in a single process.

SUMMARY OF THE INVENTION

The object of the invention is to minimize or to overcome the above noted disadvantages.

According to one aspect of this invention there is provided a process for the preparation of a semiconductor material in a strip or sheet form, including depositing the semiconductor material in an amorphous form on a strip or sheet of a thin flexible material, separating the amorphous sheet from the flexible sheet and selectively heating the amorphous semiconductor to its crystallization temperature to convert the amorphous semiconductor to single crystal material having a predetermined orientation.

According to another aspect of this invention there is provided a process for the preparation of a semiconductor material in strip or sheet form, including depositing the semiconductive material on a solid or liquid substrate surface, separating the amorphous semiconductor from the substrate and selectively heating the amorphous semiconductor to its crystallization temperature to convert the amorphous semiconductor to single crystal material.

According to a further aspect of this invention there is provided an arrangement for the production of a crystalline semiconductor material, the arrangement including a movable continuous strip of an inert flexible material, means for depositing the semiconductor in amorphous form on to the strip, removing the semiconductor sheet from the strip and means for heating the amorphous sheet to its crystallization temperature to convert the amorphous material to single crystal form having a predetermined orientation.

The term amorphous semiconductor material refers to material of the form obtained by evaporation in vacuum or more commonly that made by the cold radio frequency plasma decomposition of a volatile compound of the semiconductor, generally a hydride. For example the plasma deposition of amorphous silicon and germanium from silane and germane respectively are well known. The deposited material is non-crystalline in form and contains some residual hydrogen. In physical appearance the material is similar to the corresponding crystalline semiconductor.

For all semiconductor device preparations a continuous process of the type described herein and employing a wide continuously prepared thin sheet of high quality crystalline material offers considerable advantages. All processing steps from single crystal production, such as epitaxy, masking, diffusion, metallizing and passivation, can proceed in sequence as a non-stop rather than a batch process.

BRIEF DESCRIPTION OF THE DRAWING

An embodiment of this invention will now be described with reference to the accompanying drawing which is a schematic diagram of a semiconductor processing arrangement.

DETAILED DESCRIPTION OF THE PREFERRED EMBODIMENTS

Referring to the drawing, a semiconductor material is deposited on a continuous strip 11 of a flexible material such as polyethylene terephthalate, or PTFE supplied at a controlled speed from a storage reel 12. The flexible strip is supported on rollers 13 and is drawn through a chamber 14 wherein a radio-frequency discharge is maintained in an atmosphere of a volatile semiconductor compound so as to deposit a layer 15 of amorphous material on the strip 11. The frequency of the discharge may be from radio-frequencies (RF) below 10 kHz to microwave frequencies above 5000 MHz, and the pressure of operation may range from 0.01 Torr up to and above 760 Torr. Typically, the semiconductor material is silicon, which may conveniently be deposited from silane ($SiH_4$) at a temperature of $-50°$ C. to $+300°$ C., a pressure of 0.1 to 50 Torr and an applied frequency of 0.5 to 10 MHz. Other semiconductor materials may be deposited in amorphous form by similar techniques.

Thus, for example, amorphous germanium may be deposited from germane ($GeH_4$). No applied heat, other than that resulting from the applied electromagnetic energy, is necessary to deposit these amorphous semiconductor materials in a glow or plasma discharge.

The deposited amorphous semiconductor is of sufficient thickness to be self supporting and is separated from the flexible strip 11 after leaving the deposition chamber 14. The amorphous strip or sheet then passes adjacent a heating arrangement 16 which may comprise a laser array, an array of infra red heaters or, advantageously an electron beam heating device. The purpose of the heating arrangement is to raise the temperature of the amorphous semiconductor material to a level at which crystallization takes place. If an electron beam device is employed, the beam can be scanned back and forth across the semiconductor so as to heat a narrow strip. By careful control of the heating process the hot crystallizing zone acts as a seed with the continuous production of single crystal material 17.

The strip or sheet of crystalline semiconductor material can be wound on to a storage reel (not shown).

It is however preferred to continue processing of the crystalline material in tandem with the deposition and crystallization processes. For this purpose the semiconductor strip 17 is fed directly into a processing arrangement 18 which includes means for performing the well known processing steps of diffusion, epitaxy, masking, photolithography, metallization etc. so that devices or integrated circuits are continuously produced directly on the strip.

During the amorphous semiconductor deposition process doping of the material may be effected, e.g. by the metered addition of one or more gaseous hydrides of the elements of Group III or Group V of the periodic table. Thus diborane or phosphine may be added to silane or germane in the small quantities required to produce ultimately a desired specific resistivity in the single crystal material of either P or N type. Furthermore, as the growth of amorphous and subsequently single crystal material proceeds, the resistivity can be continuously monitored. From this measurement using a feed back loop, the level of a dopant impurity can be controlled to a desired level.

It is known from previous experience in handling hot of molten silicon of semiconductor purity that thin sections of water cooled silver may be employed as described in our published British specifications No. 827 676 (R. L. Warren-1) and No. 871 157 and our corresponding U.S. application Ser. No. 795,718 filed 2/26/59 and now abandoned (H. F. Sterling-F. J. Raymond-R. W. Warren 17-9-3). This technique may be employed to support a region of amorphous and crystalline material. In the case of germanium it is sufficient to use a graphite support in the transition zone.

In a typical process for the production of silicon strip, amorphous silicon is first deposited on a MYLAR (registered Trade Mark) plastic film strip. The deposition process is effected in a borosilicate glass vacuum chamber into which silane is admitted at a dynamic pressure of 2 Torr. The chamber is provided with plate electrodes coupled to a 10 K watt 5 MHz radio-frequency generator.

A 10 cm wide, 15 micron thick, MYLAR film strip is passed through the electrical discharge in the deposition zone. By adjustment of the power applied to the electrodes, the velocity of the film strip and the gas pressure/flow parameter, amorphous silicon is deposited on the plastic strip.

The coated strip is then fed into a second chamber where a radio frequency discharge is maintained in an atmosphere of oxygen at a pressure of 1 Torr. The plastic film is oxidized and burned away to leave the amorphous silicon strip. The reaction occurs at relatively low temperatures below 200° C., chemical activation being effected by the cold radio-frequency plasma.

The self-supporting strip of amorphous silicon is transferred through suitable vacuum seals into a crystallization chamber which is filled with pure dry argon at atmospheric pressure. A water cooled conductive, e.g. silver, platform is provided in the crystallization chamber, the platform having a transverse slot about 3 mm in width. As the amorphous semiconductor strip passes slowly across the platform and over the slot the silicon is irradiated with a focussed infra-red beam 2 mm in spot size and which is scanned back and forth across the amorphous silicon. As the silicon attains a temperature of 1420° C. conversion to single crystal material is effected. A temperature controller employing a photovoltaic device senses the temperature of the crystallization region and feeds that information back to the infra-red source so as to control the output of the source.

The crystalline silicon strip is then cooled whereupon conventional masking, diffusion, epitaxy and metallizing steps may be performed to fabricate devices on the strip. Finally the individual devices are broken from the strip, provided with conductive leads and packaged.

In a further application the amorphous semiconductor may be deposited on the surface of an inert liquid of low volatility. The self supporting amorphous material is then removed from the liquid surface for subsequent crystallization and processing. In other embodiments the amorphous semiconductor is deposited on a plastic strip which is then removed mechanically, by the action of a solvent or by thermal treatment.

Where a laser is employed to heat the amorphous semiconductor to its crystallization temperature, such a laser should of course be the continuous wave (C. W. Type). To ensure efficient coupling between the laser and the semiconductor a laser may be selected having an output frequency or frequencies corresponding to one or more absorption bands of the semiconductor material.

With some semiconductor materials the crystallization process may proceed to produce material of the desired orientation. In other cases however it may be necessary to employ a seed crystal to initiate the process and to ensure that correctly orientated material is produced.

What is claimed is:

1. In a process for the continuous manufacture of integrated circuits, the steps of:
    depositing a self-supporting layer of amorphous silicon material from a vapor phase on a continuously moving substrate for joint movement therewith,
    separating the self-supporting layer of amorphous silicon material from the substrate,
    heating increments of said separated layer of amorphous silicon material during continued movement thereof to a temperature sufficient to permit crystallization of the silicon material into a single crystal semiconductor, and
    effecting cooling of said increments at a rate inducive of crystallization of said silicon material into a single crystal semiconductor.

2. The process as defined in claim 1; and further comprising the step of fabricating integrated circuit devices on said single crystal semiconductor, breaking said devices from the remainder of said single crystal semiconductor, and packaging said devices.

3. The process as defined in claim 2, and further comprising the step of providing said devices with conductive leads prior to said packaging step.

4. The process as defined in claim 1, wherein said depositing step includes forming an atmosphere containing a gaseous hydride of the semiconductor material in the vicinity of the moving substrate; and subjecting said atmosphere to an electrical discharge.

5. The process as defined in claim 4, wherein said subjecting step includes maintaining the frequency of the electrical discharge in the radio-frequency range.

6. The process as defined in claim 5, wherein the frequency of the discharge is between 0.5 and 10 MHz.

7. The process as defined in claim 4, wherein said subjecting step includes exposing said atmosphere to microwave discharge.

8. The process as defined in claim 1, wherein said heating step includes focussing infrared radiation onto said separated layer.

9. The process as defined in claim 1, wherein said heating step includes directing a continuous wave laser beam on said separated layer.

10. The process as defined in claim 1, wherein said heating step includes bombarding said separated layer with an electron beam.

11. The process as defined in claim 1, wherein said separating step includes subjecting said layer and said substrate to a plasma-induced gas phase reaction.

12. The process as defined in claim 1, wherein said separating step includes dissolving said substrate in a solvent.

13. The process as defined in claim 1, wherein said separating step includes thermally separating said substrate from said layer.

14. The process as defined in claim 1, wherein said separating step includes mechanically separating said substrate from said layer.

15. The process as defined in claim 1; and further comprising the step of co-depositing at least one dopant with said semiconductor material during said depositing step.

16. The process as defined in claim 15; and further comprising the steps of determining the resistivity of said separated layer; and varying the concentration of said dopant in dependence on the resistance determined in said determining step.

* * * * *